United States Patent
Jain et al.

(10) Patent No.: US 11,062,576 B2
(45) Date of Patent: Jul. 13, 2021

(54) ANTI-THEFT PROTECTION SYSTEM FOR SOLAR PANEL

(71) Applicant: JAIN IRRIGATION SYSTEMS LIMITED, Jalgaon (IN)

(72) Inventors: Ajit Jain, Jalgaon (IN); Gaurav Patni, Jalgaon (IN); Abhijit Joshi, Jalgaon (IN)

(73) Assignee: JAIN IRRIGATION SYSTEMS LIMITED, Jalgaon (IN)

( * ) Notice: Subject to any disclaimer, the term of this patent is extended or adjusted under 35 U.S.C. 154(b) by 0 days.

(21) Appl. No.: 16/643,236

(22) PCT Filed: Sep. 1, 2018

(86) PCT No.: PCT/IN2018/050564
§ 371 (c)(1),
(2) Date: Feb. 28, 2020

(87) PCT Pub. No.: WO2019/043731
PCT Pub. Date: Mar. 7, 2019

(65) Prior Publication Data
US 2020/0334964 A1 Oct. 22, 2020

(30) Foreign Application Priority Data
Sep. 1, 2017 (IN) .............................. 201721031069

(51) Int. Cl.
*G08B 13/14* (2006.01)
*H01L 31/02* (2006.01)
*H01L 31/042* (2014.01)

(52) U.S. Cl.
CPC .... *G08B 13/1418* (2013.01); *H01L 31/02021* (2013.01); *H01L 31/042* (2013.01)

(58) Field of Classification Search
CPC .......... G08B 13/1418; H01L 31/02021; H01L 31/042
See application file for complete search history.

(56) References Cited

U.S. PATENT DOCUMENTS

| | | | | |
|---|---|---|---|---|
| 6,191,501 B1 * | 2/2001 | Bos | ........................... | H02J 7/35 307/64 |
| 6,650,031 B1 * | 11/2003 | Goldack | ................... | H02J 7/35 307/149 |
| 8,736,449 B2 * | 5/2014 | Sacchetti | .......... | H01L 31/02021 340/568.1 |

(Continued)

OTHER PUBLICATIONS

International Search Report and Written Opinion issued in PCT/IN2018/050564, dated May 8, 2019; ISA/US.

*Primary Examiner* — Phung Nguyen
(74) *Attorney, Agent, or Firm* — Harness, Dickey & Pierce, P.L.C.

(57) ABSTRACT

In present solar panel theft protection system, a solar panel stops generating power after it is detached from its intended system or if the solar radiation level goes below certain min level. The accordance with the present disclosure solar panel & its connected system identify each other by encrypted codes. The solar panel & its connected system communicate with each other through same power cables which are coming from solar panel (i.e. positive & negative). No extra communication cabling is required.

11 Claims, 3 Drawing Sheets

(56) References Cited

U.S. PATENT DOCUMENTS

| | | | |
|---|---|---|---|
| 8,947,194 B2* | 2/2015 | Sella | G01R 17/02 |
| | | | 340/3.1 |
| 9,007,210 B2* | 4/2015 | Avrutsky | H01L 31/02021 |
| | | | 340/568.1 |
| 10,218,307 B2* | 2/2019 | Alon | H02S 50/00 |
| 2005/0224109 A1* | 10/2005 | Posbic | H01L 31/02 |
| | | | 136/251 |
| 2010/0141424 A1 | 6/2010 | Coloma Calahorra et al. | |
| 2013/0222144 A1 | 8/2013 | Hadar et al. | |
| 2014/0230885 A1 | 8/2014 | Fyson et al. | |
| 2015/0180408 A1 | 6/2015 | Pisklak et al. | |

\* cited by examiner

ANTI-THEFT PROTECTION SYSTEM FOR SOLAR PANEL

CROSS REFERENCE TO RELATED APPLICATIONS

This application is a U.S. National Phase Application under 35 U.S.C. 371 of International Application No. PCT/IN2018/050564 filed on Sep. 1, 2018, which claims the benefit of priority from Indian Application 201721031069 filed on Sep. 1, 2017. The entire disclosures of all of the above applications are incorporated herein by reference.

TECHNICAL FIELD

The present disclosure described herein, in general, relates to a protection device more particularly to an anti-theft protection device for the solar panels.

BACKGROUND

Theft of solar panels from un-protected sites is very common. In order to reduce the theft, a host of anti-theft device are available in market. For e.g. antitheft nuts, buzzers, or tracking systems. However, the major drawback of these systems is that are mounted externally on the panels. Further if the panels are stolen there is no way to disable the solar panels.

SUMMARY

This summary is provided to introduce concepts related to an anti-theft device for solar panel and the concepts are further described below in the detailed description. This summary is not intended to identify essential features of the claimed subject matter nor is it intended for use in determining or limiting the scope of the claimed subject matter.

In an implementation of the present disclosure an anti-theft system has been disclosed. The system may comprise a junction box. The junction box may be mounted directly on the solar panel at the terminal junction. The junction box on a first end is communicably connected with 2 very short terminal protruding from a solar panel. Further the junction box has two long terminal protruding from a second end of the junction box. The junction box further comprises a module to encrypt and decrypt signal received to and from the solar panel.

DETAILED DESCRIPTION

The present disclosure discloses an aspect of an anti-theft system for a solar panel. Even though the present system is primarily designed for authenticating solar panel and its subsystem, it can also be used for other applications such as batteries, luminaries etc.

Figure 1:
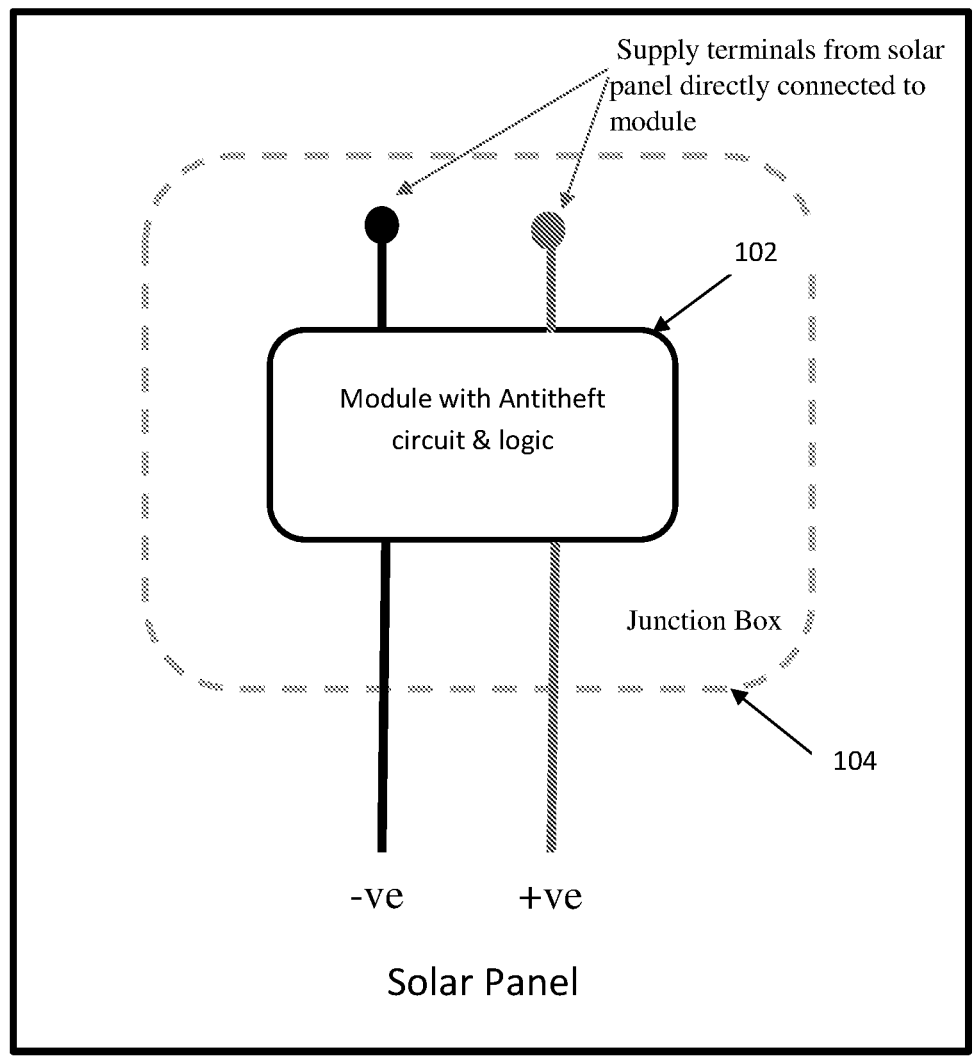
FIG. 1 illustrates an anti-theft system, in accordance with the present disclosure.

FIG. 1 illustrates an anti-theft system, in accordance with the present disclosure. The system as disclosed may comprise a module 102 having anti-theft circuitry and logic integrated within the module. The module 102 may be directly mounted on a solar panel and enclosed in a junction box 104 or any type of housing mechanism. The module 102 may be connected at the location where electric terminals protrude from the solar panel. Further the module 102 may be configured to provide electrical terminals to connect at least one sub-system. In an exemplary embodiment the sub-system are devices or systems that utilize the power generated from the solar panel.

Further the location and position of the module 102 directly on the terminal exiting from the solar panel is an essential feature. Mounting and sealing of the junction box 104 comprising the module 102 directly over the terminal protruding from solar panel prevents direct access to these terminals hence does not allow tampering, because if someone does try to tamper, the terminal will also get destroyed during tampering, while disabling the solar panel as usable. The electric terminals protruding from the junction box having module with anti-theft circuitry and logic may further be configured to communicate with the subsystem apart from providing a +ve and −ve terminal for the power cable.

The anti-theft circuitry and logic may be implemented using a processor or a micro controller. The anti-theft circuitry and logic may use a first sensor to detect the power generated by solar panel. Further based on the detection of the power, a code generator, integral to the anti-theft circuitry and logic, may be configured to validate and authenticate connected sub-system and the solar panel before enabling power to the subsystem. The authentication by the code generator may be done using encryption and decryption key or any other authentication logic.

In another exemplary embodiment, the module may be integrated into the solar panel directly.

The module may be configured to send or receive and read an encrypted or decrypted signal via the power cable, or a separate cable, or wireless. Only when the signal matches the module will allow the energy generated by the solar panel to the subsystem. Failure to verify or validate the signal, the module will then disable the solar panel.

Figure 2:
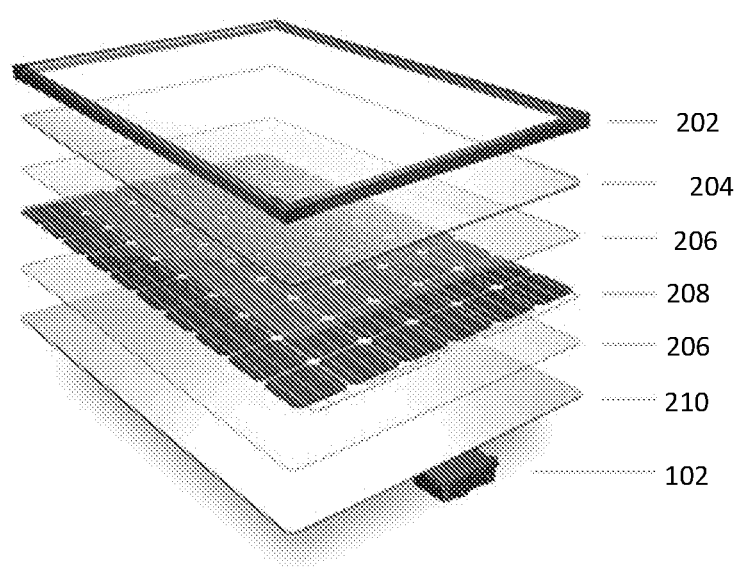
FIG. 2 illustrates an exemplary embodiment in accordance with the present disclosure.

FIG. 2 illustrates an exemplary embodiment in accordance with the present disclosure. The solar panel 200, may comprise a frame 202. The frame 202 may be peripheral structure with defined geometry. Further the frame 202 may comprise a glass 204 mounted within the frame 202. The glass 204 may further be mounted on an encapsulant 206. An array of solar cell 208 may be sandwiched between two encapsulant 206. Further a back-sheet 210 may seal all the component within the frame 202. Further a junction box having module with anti-theft circuitry and logic 102, may be mounted directly on the back-sheet 210. The module with anti-theft circuitry and logic can be integrated or attached with solar panel with any other assembling or manufactured technique.

Further if solar panel having module with anti-theft circuitry and logic when not connected to subsystem does not produce any kind of electrical or communication signal. This prevents intruder from decoding or manipulating the anti-theft logic inside the module.

Figure 3:
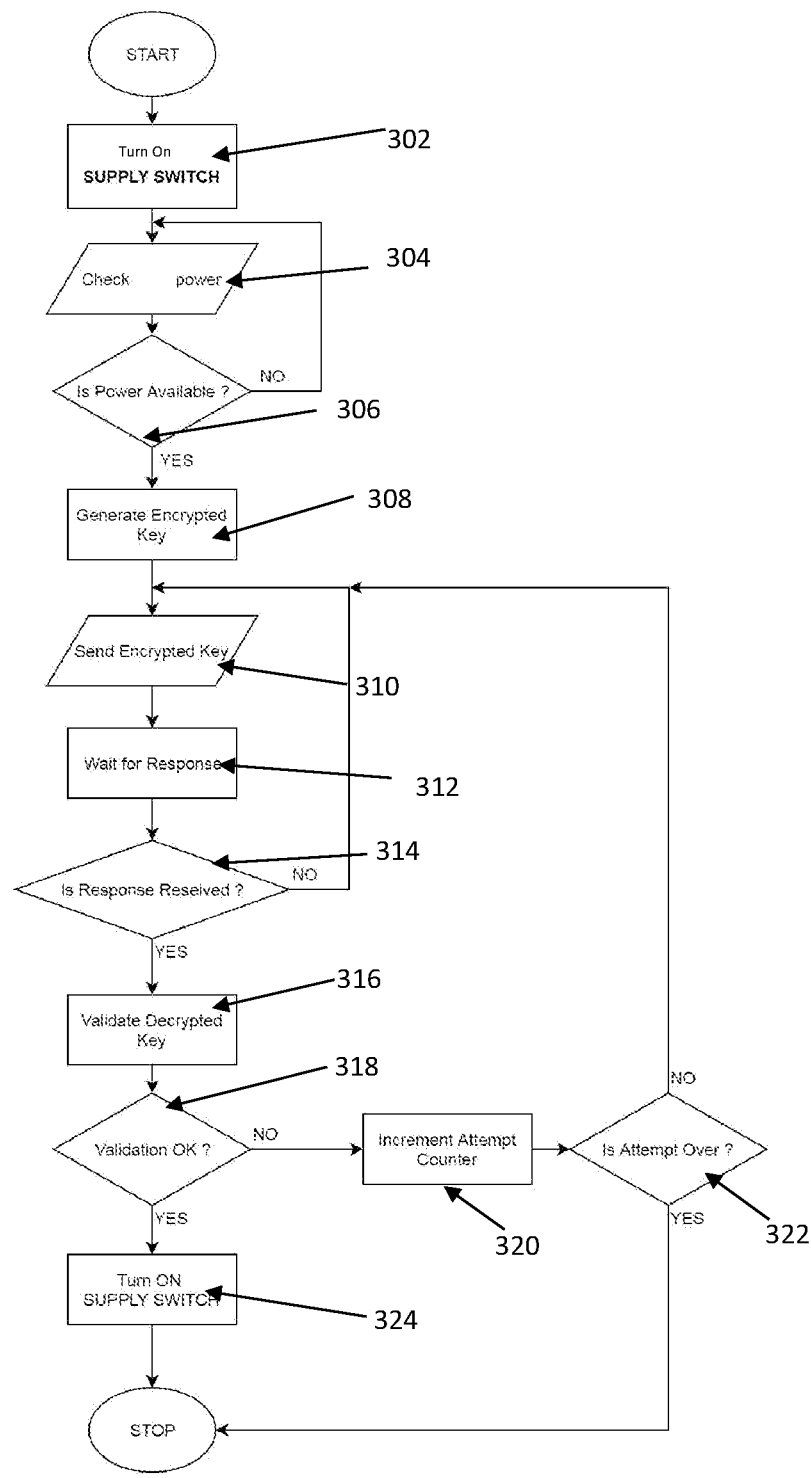
FIG. 3 illustrates a flow chart in accordance with an exemplary embodiment of the present disclosure.

FIG. 3 illustrates a flow chart in accordance with an exemplary embodiment of the present disclosure. According to the present disclosure when the system in switched "ON" i.e. started after getting the radiation, the system checks for the availability of solar power, as illustrated in step 302. Further on detection of availability of solar power via the solar panel in step 304 and 306, an encryption key is randomly generated in step 308. The encryption key can be generated in the solar panel, or in a module integrated into the solar panel, or in an external generator. Further based on location of the generation of the encrypted key, the encrypted key may be then sent for validation in step 310, wherein the encrypted key is decrypted in step 316 by peer system. Once a positive validation is received as in step 318 the supply from the solar panel is initiated in step 324. In another embodiment if the validation fails an iterative attempt at validation is made as per step 320 and 322.

We claim:

1. An anti-theft system comprising:
   a solar panel;
   a junction box mounted directly on the solar panel and communicably connected with two electric terminals protruding or exiting from the solar panel at a first end;
   a module with an anti-theft circuitry and logic directly mounted on the solar panel and enclosed in the junction box, wherein the module is communicably connected with the solar panel and mounted on two electric terminals protruding or exiting from the solar panel at the first end of the junction box; and
   at least one sub-system communicably connected with two terminals protruding or exiting from a second end of the junction box;
   wherein the module is powered by the solar power generated by the solar panel, and the module is configured to detect the solar power generated by the solar panel and to validate and authenticate the at least one sub-system and the solar panel based on the receipt of an encrypted signal and a decrypted signal, via a communication link, for enabling and disabling the supply of solar power to the at least one sub-system,
   wherein the module is configured to enable the supply of power from the solar panel to the at least one sub-system on a positive validation, wherein the positive validation comprises matching of the encrypted signal and the decrypted signal with the module, from the solar panel and the at least one sub-system, and the module is configured to disable the supply of power from the solar panel to the at least one sub-system on detection of tampering to the solar panel or on failure to validate and authenticate the solar panel and the at least one sub-system.

2. The system as claimed in claim 1, wherein the module with the anti-theft circuitry and logic is integrated into the solar panel directly.

3. The system as claimed in claim 1, wherein the module with the anti-theft circuitry and logic is configured to send, receive and read the encrypted and the decrypted signal to and from the solar panel and the at least one the sub-system, via the communication link.

4. The anti-theft system as claimed in claim 1, wherein the module is configured to validate and authenticate at least one sub-system and the solar panel based on the detection of the power from the solar panel.

5. The system as claimed in claim 1, wherein the communication link is selected from a power cable and a wireless link.

6. The anti-theft system as claimed in claim 1, wherein the module comprises a first sensor, a code generator, a processor and a micro controller for implementing the anti-theft circuitry and logic.

7. The anti-theft system as claimed in claim 1, wherein the encrypted signal comprises an encryption key and decrypted signal comprises a decryption key.

8. The anti-theft system as claimed in claim 1, wherein the module is configured to generate signals only, when the at least one sub-system is connected with the junction box.

9. The anti-theft system as claimed in claim 1, wherein the module is configured to enable the supply of power from the solar panel to the subsystem through a switch upon the positive validation.

10. The anti-theft system as claimed in claim 1, wherein the module is configured to validate and authenticate at least one sub-system and the solar panel before enabling the power to the subsystem.

11. An anti-theft apparatus comprising:
    a solar panel, comprising a frame, wherein the frame comprises:
    a glass mounted within the frame, the glass is mounted on an encapsulant;
    an array of solar are sandwiched between the encapsulant and another encapsulant;
    a back-sheet sealing the glass, two encapsulants and the array of solar cells within the frame; and
    a junction box having a module with an anti-theft circuitry and logic, mounted directly on the back-sheet of the solar panel;
    wherein the module is powered by the solar power generated by the solar panel and the module is configured to validate and authenticate at least one sub-system and the solar panel based on the receipt of an encrypted signal and decrypted signal, via a communication link, for enabling and disabling the supply of solar power to the at least one sub-system,
    wherein the module is configured to enable the supply of power from the solar panel to the at least one sub-system on a positive validation, wherein the positive validation comprises matching of the encrypted signal and the decrypted signal with the module, from the solar panel and the at least one sub-system, and the module is configured to disable the supply of power from the solar panel to the at least one sub-system on detection of tampering to the solar panel or on failure to validate and authenticate the solar panel and the at least one sub-system.

* * * * *